(12) United States Patent
Montrose

(10) Patent No.: US 6,429,641 B1
(45) Date of Patent: Aug. 6, 2002

(54) POWER BOOSTER AND CURRENT MEASURING UNIT

(75) Inventor: Charles J. Montrose, Clintondale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/579,051

(22) Filed: May 26, 2000

(51) Int. Cl.[7] .................. G01R 1/30; G01R 17/06; G01R 15/08; G05F 1/573; G05F 1/62

(52) U.S. Cl. ............... 324/123 C; 324/115; 324/99 D; 323/282; 323/277

(58) Field of Search .................... 324/611, 609, 324/612, 115, 131, 99 D, 765, 158.1, 123 C; 330/2; 323/277, 280, 282

(56) References Cited

U.S. PATENT DOCUMENTS

| | | | |
|---|---|---|---|
| 3,648,175 A | * | 3/1972 | Barnard et al. ............. 324/115 |
| 4,109,213 A | * | 8/1978 | Holley et al. ................ 330/2 |
| 4,739,252 A | * | 4/1988 | Malaviya et al. ........... 324/115 |

* cited by examiner

*Primary Examiner*—N. Le
*Assistant Examiner*—Anjan K. Deb
(74) *Attorney, Agent, or Firm*—Ratner & Prestia; Tiffany L. Townsend, Esq.

(57) ABSTRACT

A power booster and current measuring circuit provides a quiet, accurate voltage to a load (such as a transistor during parametric testing) with a load current of up to 1 ampere, and can measure that load current to an accuracy of ±0.1 % over a range of currents extending nine orders of magnitude (e.g., 1 ampere to $10^{-9}$ amperes). The load voltage is supplied by a sense driver, a bypass driver, or both. The bypass driver comprises a high-current operational amplifier with a direct feedback loop (e.g., a voltage follower). The sense driver comprises a high-impedance operational amplifier having a feedback loop comprising a high-current operational amplifier connected as a voltage follower and one of a series of sense resistors having different values. The load current is determined by measuring the voltage drop across the sense resistor in the high-impedance operational amplifier feedback loop using an instrumentation amplifier, and dividing the measured voltage drop by the known resistance of the selected sense resistor. Also disclosed is a method of providing a constant voltage to a load over a range of currents and for accurately measuring the current drawn by the load.

21 Claims, 6 Drawing Sheets

POWER BOOSTER AND CURRENT MEASURING UNIT

TECHNICAL FIELD

The present invention relates generally to electronics and more specifically to a device and method for supplying power at a set voltage over a wide range of current values for parametric testing and simultaneously providing the ability to measure the current driving the load (device) being tested with three-figure (i.e., ±0.1%) accuracy.

BACKGROUND OF THE INVENTION

When performing parametric testing on a device such as a transistor or on an entire integrated circuit (IC), it is frequently necessary to provide power at an accurate voltage over a wide range of load current (many orders of magnitude) and to accurately measure this current. Also, it is necessary to provide a quiet voltage (i.e., no voltage spikes). For example, in parametric characterization it may be desirable to provide a constant voltage over a load current range of from 1 ampere down to 1 nanoampere ($10^{-9}$ amperes) while accurately measuring the load current over this range.

The various types of equipment currently available for providing a constant voltage during parametric testing all suffer from deficiencies which impede testing. One method for providing power during parametric testing is a conventional power supply. Typical power supplies do not provide, however, either high voltage resolution or accurate current measurement ability. Standard power supplies do provide current read back using an analog-to-digital converter (ADC) to measure the current. An ADC is an electronic circuit that receives a magnitude-scaled analog voltage and generates a binary-coded number proportional to the analog input, which is delivered to an interface subsystem to a digital computer. The ADC is usually twelve-to-sixteen bits and is set for full-scale at maximum current. This configuration yields current measurement resolution in the milli-ampere range, which is inadequate for smaller load currents.

Digital multi-meters (DMMs) typically do not provide the broad range of current measurement necessary for parametric testing. Most DMMs only provide three orders of magnitude ($10^3$) of current range and not the nine orders of magnitude ($10^9$) necessary for parametric characterization. Other DMMs have a tendency to go into "voltage compliance" as they range upscale, losing the ability to maintain a constant voltage at the load. The current goes out-of-range with a loss of control over the output voltage, and builds up a voltage burden at the output measuring hundreds of millivolts.

The deficiencies of the conventional equipment and methods for supplying a constant, quiet voltage and measuring load current during parametric testing show that a need still exists for improvement. To overcome the shortcomings of the conventional equipment, a new circuit is provided for supplying a constant voltage and measuring load current. It is an object of the present invention to provide a circuit for supplying a constant voltage and accurately measuring load current during parametric testing. It is another object of the present invention to provide a quiet voltage environment.

SUMMARY OF THE INVENTION

To achieve these and other objects, and in view of its purposes, the present invention provides a circuit for driving a load voltage to the same value as an input voltage over a wide range of currents. The circuit keeps the voltage quiet and stable. The circuit also accurately measures the current drawn by the load.

The circuit of the present invention incorporates a sense driver and a bypass driver. The load voltage can be driven by the sense driver, the bypass driver, or both, by way of switches (relays) at the driver outputs (e.g., the feedback loops). The bypass driver comprises a high-current operational amplifier (op amp) capable of driving a load voltage at up to 2 amperes and a feedback loop. The sense driver differs from the bypass driver in that it has a high-impedance op amp connected in series with a high-current op amp. The high-current op amp has a direct feedback loop and operates as a voltage follower. The sense driver further differs from the bypass driver in that it includes a series of sense resistors, any one of which can be selected (i.e., connected into the high-impedance op amp feedback loop). A particular sense resistor can be selected by closing its corresponding switch (relay) and opening the corresponding switches (relays) for each of the other sense resistors.

The sense resistors are used to create a voltage drop whose magnitude is dependant upon the load current. The load current flows through the selected sense resistor, generating a voltage drop equal to the load current times the resistance of the selected sense resistor. Because the resistance of the selected sense resistor is known to within ±0.1%, the load current is calculated by dividing the measured voltage drop by the known resistance.

An appropriate sense resistor must be chosen for the magnitude of the load current being measured. If the resistance is too low, the voltage drop will be too small to measure accurately. If the resistance is too high, the sense driver will not be able to provide a high enough voltage output to supply the voltage drop (i.e., the sense driver will saturate), and the load voltage will no longer equal the input voltage. A microcontroller and voltage comparator circuit can be used to choose the appropriate sense resistor to avoid either of these undesirable conditions.

When switching sense resistors in and out by way of the switches (relays), momentary conditions may occur for which the output of the sense driver generates noise. This noise should not be coupled to the load, as it may cause damage. This condition can be avoided by first switching "in" the bypass driver, by connecting the bypass driver to the load by closing a bypass relay, and then switching "out" the sense driver, by disconnecting the sense driver from the load by opening a sense relay. In this way, the sense resistors can be switched while the sense driver is not connected to the load. The sense driver is switched back "in" and the bypass driver is switched back "out" for load current measurements.

The present invention provides considerable improvement over the conventional devices available for providing a constant voltage during parametric testing. A constant, accurate, quiet voltage is driven to a load, while providing an autoranging current sense point. The sensed current can be made accurate over many orders of magnitude by providing a bank of sense resistors, each an order of magnitude apart from the previous resistor (e.g., 1 ohm, 10 ohms, 100 ohms, etc.).

The present invention also encompasses a method of providing a constant voltage to a load over a range of currents and for accurately measuring the current drawn the load. The method comprises a number of steps. Specifically, the method provides a programming voltage to the inputs of a sense driver and a bypass driver. The bypass driver consists of a high-current op amp acting as a voltage follower. The sense driver comprises a high-input impedance op amp with a feedback loop, which drives its output voltage to its input voltage plus the voltage drop in its feedback loop. The sense driver feedback loop comprises a high-current op amp, which acts as a voltage follower, providing an output voltage equal to its input voltage at a current required to provide such output voltage to the load, and a sense resistor selected from a series of sense resistors having different resistance values.

After providing a programming voltage to the inputs of the sense driver and the bypass driver, the method selects the appropriate sense resistor such that its voltage drop at the load current can be accurately measured without saturating the sense driver. The method then connects the bypass driver, the sense driver, or both to a load. Finally, the method measures the voltage drop across the sense resistor which is in the sense driver feedback loop to determine load current.

It is to be understood that both the foregoing general description and the following detailed description are exemplary, but are not restrictive, of the invention.

BRIEF DESCRIPTION OF THE DRAWING

The features and advantages of a circuit and method for providing a quiet, stable, accurate load voltage (output) over a wide range of load currents and for accurately measuring the load current according to the present invention and further details of a process of fabricating such a device in accordance with the present invention will be more clearly understood from the following description when read in connection with the accompanying Included in the drawing are the following figures.

DETAILED DESCRIPTION OF THE INVENTION

The present invention will be described in detail with reference to the accompanying drawing in which like reference numbers designate similar or corresponding elements, regions, and portions. The present invention provides a device (circuit) and a method for providing a quiet, stable, accurate load voltage (output) over a wide range of load currents and for accurately measuring the load current.

Figure 1:
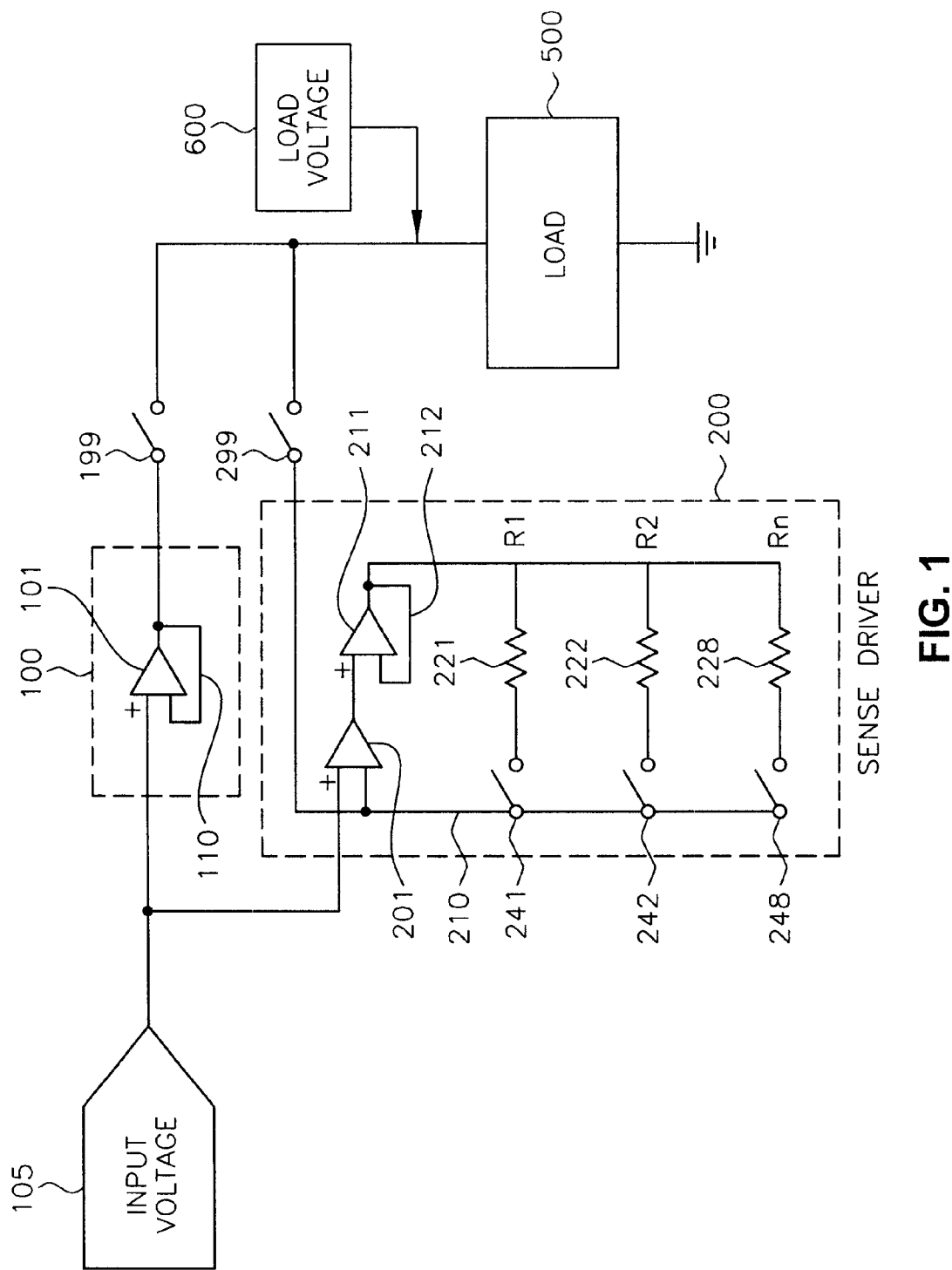
FIG. 1 is a block, diagram of the present invention showing the sense driver and the bypass driver.

FIG. 1 shows a block diagram of the sense driver (200) and the bypass driver (100). As shown, an input voltage (105) such as from a voltage source is supplied to both the sense driver (200) and the bypass driver (100). Either the sense driver (200), the bypass driver (100), or both can be used to drive a load voltage (600) to a load (500), by closing the sense relay (299), the bypass relay (199), or both. In a parametric test, the load (500) is the device being tested, such as a transistor, diode, IC, or the like.

Also, as shown in FIG. 1, the sense driver (200) has a series of "n" sense resistors (R1, R2, ... Rn). Any number of sense resistors (R1, R2, ... Rn) can be used. In the preferred embodiment illustrated, however, there are eight sense resistors: a first sense resistor (221), a second sense resistor (222), and an eighth sense resistor (228) are shown. Sense resistors (221, 222, ... 228) can be selected or connected into the circuit, such that the load current is drawn through the selected sense resistor, by closing one of corresponding sense resistor relays (241, 242, ... 248) which corresponds to the sense resistor selected. Although the sense resistors (R1, R2, ... Rn) can have any values, in the preferred embodiment the eight sense resistors (221, 222, ... 228) have resistance values which increase one order of magnitude over the previous sense resistor. For example, the first sense resistor (221) may have a resistance of 1 ohm; the second sense resistor (222) may have a resistance of 10 ohms; the third sense resistor (not shown) may have a resistance of 100 ohms; and so forth, until the eighth sense resistor (228) may have a resistance of $10^7$ ohms (10 megaohms).

The load current passes through the selected sense resistor (221, 222, ... 228), causing a voltage drop across the selected sense resistor equal to the load current times the resistance. This voltage drop is measured and divided by the known resistance of the selected sense resistor to determine the load current. The appropriate value sense resistor is selected such that the voltage drop across the selected sense resistor is sufficient to be accurately measured without being so great that the sense driver (200) is saturated, causing the load voltage (600) to be less than the input voltage (105).

Figure 2:
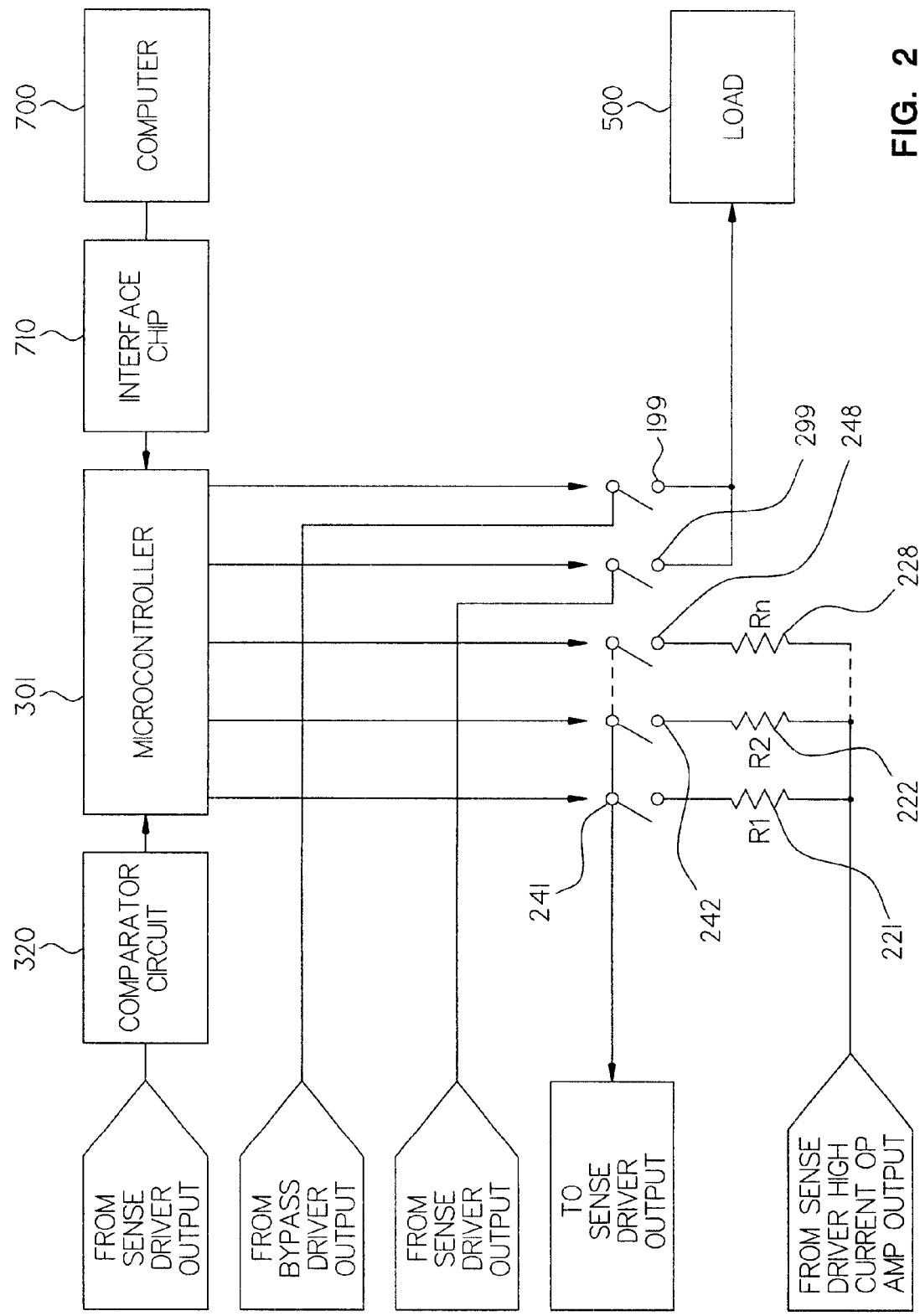
FIG. 2 is a block diagram of a preferred embodiment of the mechanism for selecting the appropriate sense resistor for a particular load voltage and load current.

Referring to FIG. 2, a preferred embodiment of the mechanism for selecting the appropriate sense resistor (221, 222, ... 228) for a particular load voltage (600) and load current is the use of a microcontroller (301), such as a Motorola model MC68HC811E2FN, and a voltage comparator circuit (320). The microcontroller (301) receives data indicating the present load voltage from the comparator circuit (320) and signals indicating when a measurement is to be taken from a computer (700). As shown in FIG. 2, the computer (700) communicates to the microcontroller (301) through an interface chip (710).

The microcontroller (301) is programmed to process the information it receives from the comparator circuit (320) and from the computer (700) and to provide a voltage signal which closes the appropriate sense resistor relay (241, 242, ... 248) thereby causing the appropriate sense resistor (221, 222, ... 228) to be connected into the sense driver feedback loop. The appropriate sense resistor is the sense resistor which provides a voltage drop sufficient to be accurately measured while being small enough that the sense driver (200) does not saturate. The microcontroller (301) is also programmed such that the bypass driver (100) is switched "in" by closing the bypass relay (199), and sense driver (200) is switched "out" by opening the sense relay (299), before switching between sense resistors.

Figure 3A:
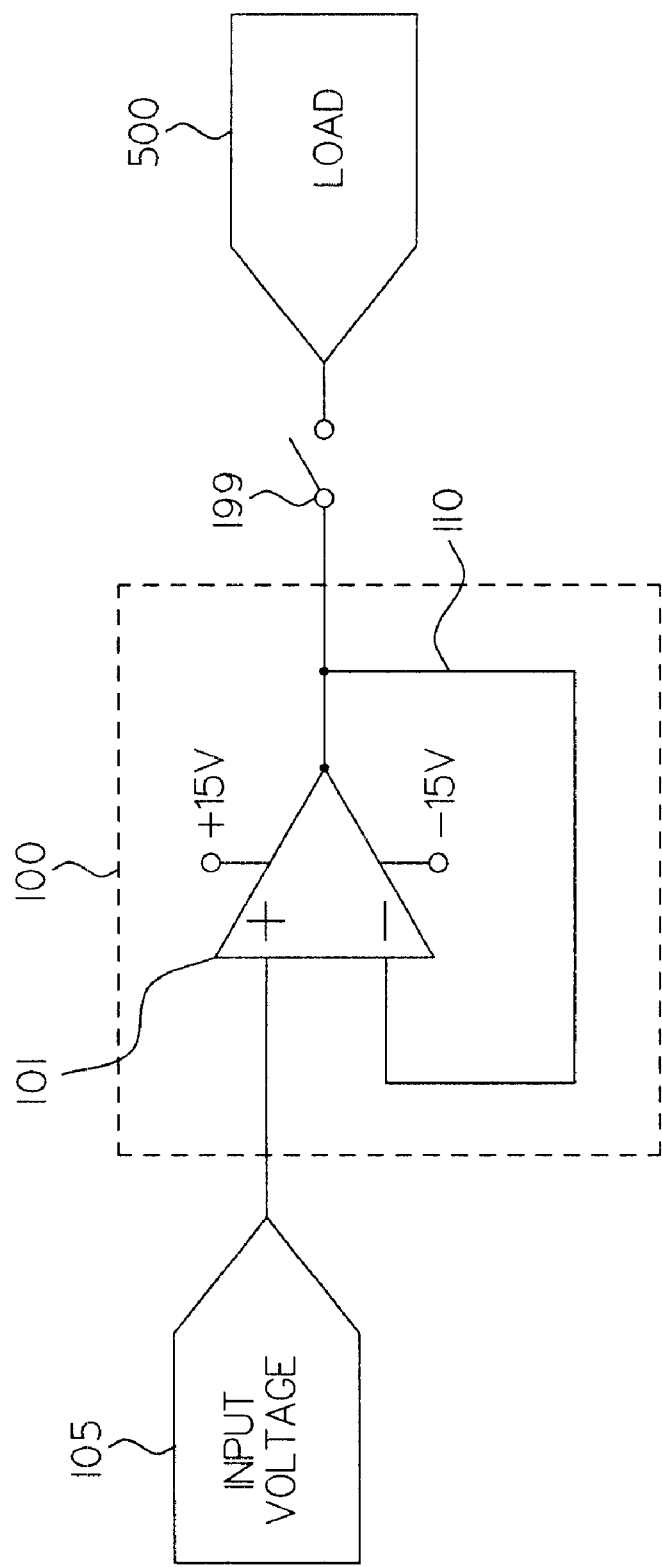
FIG. 3A is a detailed schematic of a bypass driver according to the present invention.

The bypass driver (100) is shown in FIG. 3A. The input voltage (105), preferably from an accurate voltage source, is provided to the non-inverting input of a high-current operational amplifier or "op amp" (101). A suitable op amp (101) is the Burr Brown model OPA544T. Op amp (101) is a dc amplifier having both an inverting and a noninverting input and one output, with a very large gain from input to output. The high-current op amp (101) is provided with power, and the output of high-current op amp (101) is connected directly to the inverting input of high-current op amp (101). Thus, high-current op amp (101) has a direct feedback loop (110). The output of the high-current op amp (101) is also connected to the bypass relay (199) as shown. When the bypass relay (199) is closed by the microcontroller (301), the bypass driver (100) drives the load (500) at the same voltage as the input voltage (105). The output current, which is dependant upon the load impedance, can vary up to 1 ampere.

Figure 3B:
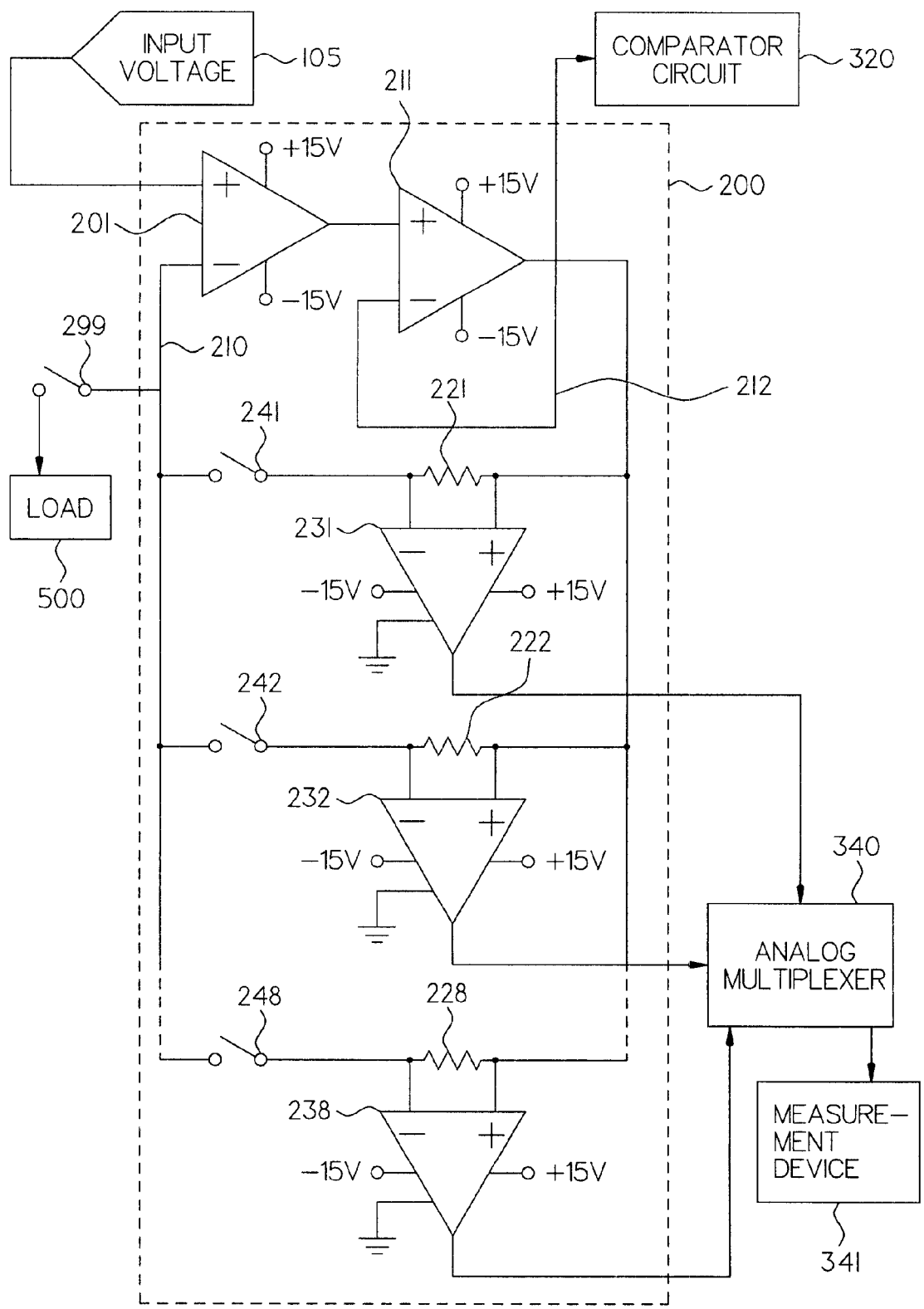
FIG. 3B shows a conceptual schematic of a sense driver according to the present invention.

A conceptual schematic of the sense driver (200) is shown in FIG. 3B. The input voltage (105) is provided to the non-inverting input of a high-impedance op amp (201), such as a Burr Brown model OPA129UB, in the sense driver (200). The input voltage (105) is the same input voltage (105) provided to the non-inverting input of the high-current op amp (101 in FIG. 3A) of the bypass driver (100 from FIG. 3A). The output of the high-impedance op amp (201) is provided to the non-inverting input of a high-current op amp (211), which is preferably the same model as the high-current op amp (101 in FIG. 3A) in the bypass driver (100 in FIG. 1). The high-current op amp (211) has a direct feedback loop (212), because the output of high-current op amp (211) is connected directly to the inverting input of high-current op amp (211), causing high-current op amp (211) to act as a voltage follower: the output voltage of high-current op amp (211) is driven to match the non-inverting input voltage of high-current op amp (211).

The output of the high-current op amp (211) is provided to a selected sense resistor (221, 222, ... 228) by closing the corresponding sense resistor relay (241, 242, ... 248). For example, if the first sense resistor (221) has the appropriate resistance for the load current being drawn, the first sense resistor relay (241) would be closed by the microcontroller (301 in FIG. 2) causing the output current of the high-current op amp (211) to flow through the first sense resistor (221). In this example, the other sense resistor relays (242, ... 248) would remain open.

After the output current from the high-current op amp (211) passes through the selected sense resistor and the corresponding sense resistor relay, voltage is provided to the inverting input of the high-impedance op amp (201). The feedback loop (210) for the high-impedance op amp (201) therefore comprises the high-current op amp (211), acting as a voltage follower, and the selected sense resistor. The output voltage for the high-impedance op amp (201) is equal to the non-inverting input voltage of the high-impedance op amp (201) plus the voltage drop across the selected sense resistor.

The comparator circuit (320) is connected to the output of the high-current op amp (211). The comparator circuit (320) provides a signal to the microcontroller (301) when the voltage at the high-current op amp (211) output exceeds set high and low limits. The limits are pre-determined to ensure accurate measurement without saturation.

The load (500) is connected to the feedback loop (210), after the sense resistor relays (241, 242, ... 248), through the sense relay (299). The load (500) is driven at a voltage which is equal to the non-inverting input voltage of the high-impedance op amp (201).

As shown in FIG. 3B, instrumentation amplifiers (231, 232, ... 238) are connected across the sense resistors (221, 222, ... 228) at their inputs. The instrumentation amplifiers (231, 232, ... 238), which also have power and a reference voltage, provide a voltage signal to an analog multiplexer (340) equal to the voltage drop across the corresponding sense resistor (221, 222, ... 228). The analog multiplexer (340) then provides the voltage signal from the instrumentation amplifier (231, 232, ... 238) across the selected sense resistor (221, 222, ... 228) to a measurement device (341), such as a digital volt meter. The load current can be calculated by dividing the measured voltage drop across the selected sense resistor by the known resistance value of the selected sense resistor.

Figure 4:
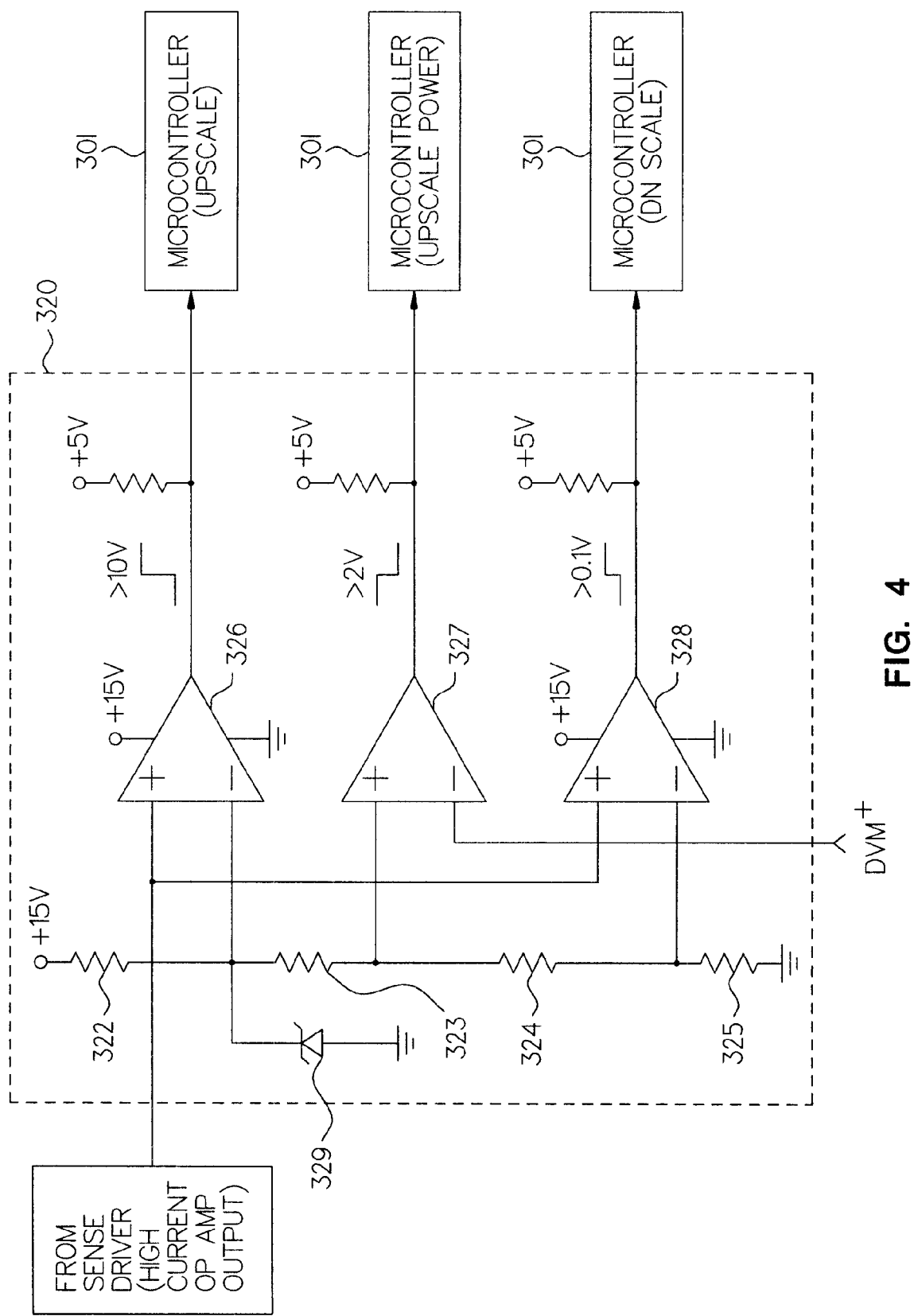
FIG. 4 is a detailed schematic of a comparator circuit according to the present invention; an FIG. 5 is a schematic for a filter for preventing oscillation when connecting a high-impedance op amp in series with a high-current op amp according to the present invention.

FIG. 4 shows a comparator circuit (320) according to a preferred embodiment of the present invention. A voltage signal from the output of the high-current op amp (211 in FIG. 3B) in the sense driver (200 in FIG. 1) is provided to the non-inverting inputs of an UP SCALE comparator amplifier (326) and a DN SCALE comparator amplifier (328). A voltage splitter is formed by voltage splitter resistors connected in series between power and ground.

In the preferred embodiment, four voltage splitter resistors (322, 323, 324, 325) are used to provide voltage references to the UP SCALE comparator amplifier (326), the DN SCALE comparator amplifier (328), and an UP SCALE POWER comparator amplifier (327). For purposes of example only, and without limitation, the first splitter resistor (322) may have a resistance of about 470 ohms, the second splitter resistor (323) may have a resistance of about 1.5 K ohms, the third splitter resistor (324) may have a resistance of about 390 ohms, and the fourth splitter resistor (325) may have a resistance of about 27 ohms. The first splitter resistor (322), the second splitter resistor (323), the third splitter resistor (324), and the fourth splitter resistor (325) may be connected sequentially in series between a +15 volt power source and ground.

The inverting input of the UP SCALE comparator amplifier (326) is connected between the first voltage splitter resistor (322) and the second voltage splitter resistor (323), where the voltage is equal to the up scale limit. The up scale limit is the voltage at which the microcontroller (301) is to switch to a lower resistance sense resistor, for example 10 volts. A zener diode (329) can be connected between the junction of the first voltage splitter resistor (322) and the second voltage splitter resistor (323) and ground, as shown in FIG. 4, to provide a voltage reference.

When the non-inverting input voltage for the UP SCALE comparator amplifier (326) is greater than the inverting input voltage for the UP SCALE comparator amplifier (326), the output of the UP SCALE comparator amplifier (326) goes high (e.g., to 5 volts), providing a high voltage signal to the microcontroller (301 in FIG. 2). The inverting input of the DN SCALE comparator amplifier (328) is connected between the third voltage splitter resistor (324) and the fourth voltage splitter resistor (325), where the voltage is equal to the down scale limit. The down scale voltage limit is the voltage at which the microcontroller (301) is to switch to a higher resistance sense resistor, for example 0.1 volts.

When the non-inverting input voltage for the DN SCALE comparator amplifier (328) is greater than the inverting input voltage for the DN SCALE comparator amplifier (328), the DN SCALE comparator amplifier (328) goes high (e.g., to 5 volts), providing a voltage signal to the microcontroller (301 in FIG. 2).

The non-inverting input of the UP SCALE POWER comparator amplifier (327) is connected between the second voltage splitter resistor (323) and the third voltage splitter resistor (324), where the voltage is equal to the up scale voltage limit. The up scale voltage limit is the voltage at which the microcontroller (301) is to switch to a lower resistance sense resistor to prevent saturation of the sense driver operational amplifier, or excessive power dissipation from the selected sense resistor (whichever occurs first). The inverting input of the UP SCALE POWER comparator amplifier (327) is connected to the positive terminal of the voltage measurement device (341).

Figure 5:
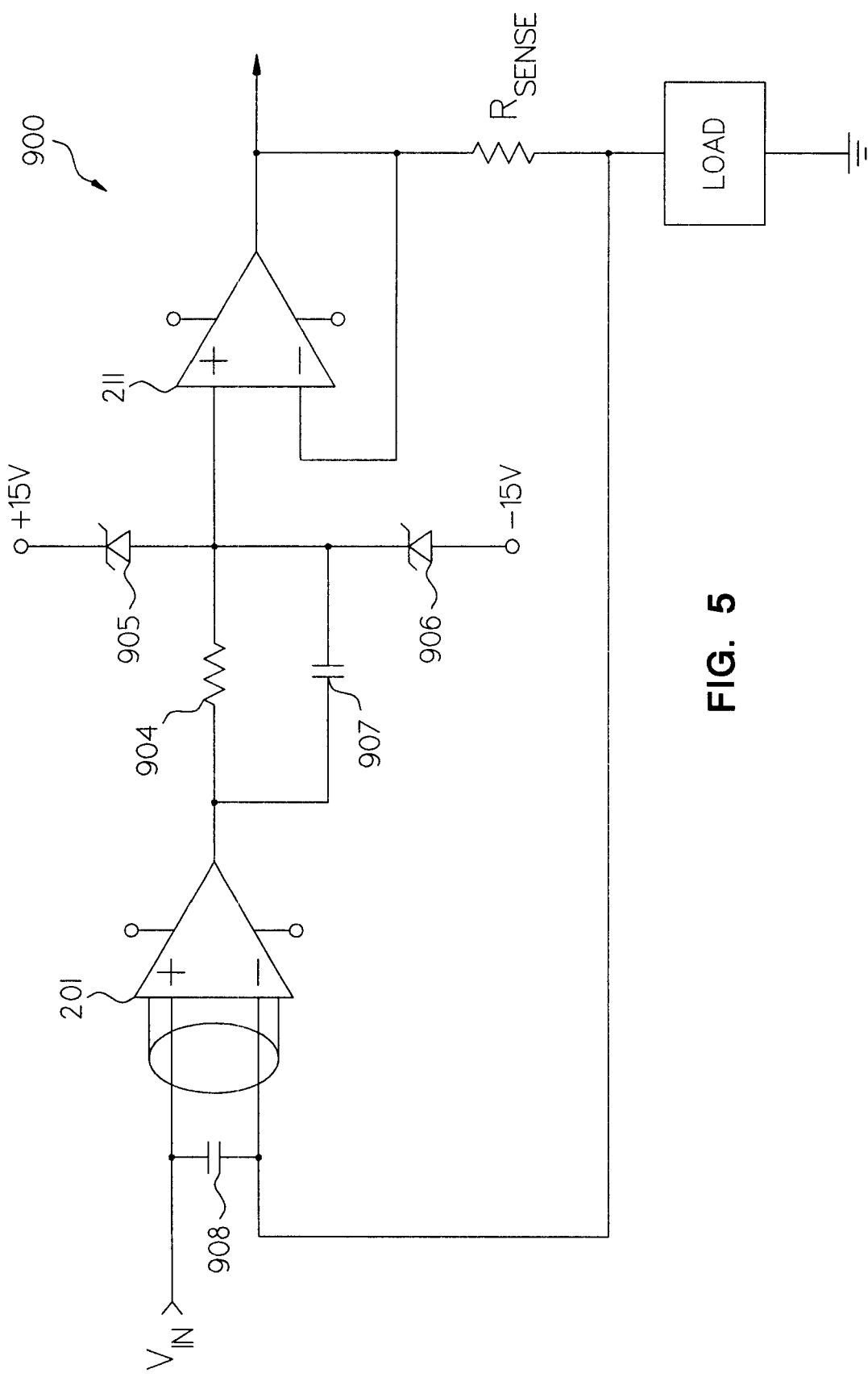

FIG. 5 shows a filter for preventing oscillation and maintaining a quiet voltage when the high-impedance op amp (201) is connected in series with the high-current op amp (211). A resistor (904) and zener diodes (905 and 906) form a voltage limiter, holding the voltage between 0 and 10 volts. A capacitor (907) slows down the signal from the high-impedance op amp (201), preventing oscillation. Another capacitor (908) slows down the signal into the high-impedance op amp (201), preventing oscillation.

The present invention also encompasses a method of providing a constant voltage to a load over a range of currents and for accurately measuring the current drawn by the load. The method comprises a number of steps. Specifically, the method provides a programming voltage to the inputs of a sense driver and a bypass driver. The bypass driver has a high-current op amp acting as a voltage follower and the sense driver has a high-input impedance op amp with a feedback loop which drives its output voltage to its input voltage plus the voltage drop in its feedback loop. The sense driver feedback loop includes a high-current op amp which acts as a voltage follower, providing an output voltage equal to its input voltage at a current required to provide such output voltage to the load, and a sense resistor selected from a series of sense resistors having different resistance values.

The method then selects the appropriate sense resistor such that its voltage drop at the load current can be accurately measured without saturating the sense driver. The appropriate sense resistor is selected using a voltage comparator circuit, a microcontroller, and sense resistor relays. At least one of the bypass driver and the sense driver are next connected to the load. The sense driver, the bypass driver, or both are connected to the load by a sense relay and a bypass relay, which are opened or closed by the microcontroller depending upon voltage signals from the voltage comparator circuit. Finally, the method includes the step of measuring the voltage drop across the sense resistor which is in the sense driver feedback loop to determine load current. The voltage drop across the sense resistor in the sense resistor feedback loop is measured using an instrumentation amp having inputs connected across the resistor and an output connected through an analog multiplexer to a voltage measurement device.

Although illustrated and described above with reference to certain specific embodiments, the present invention is nevertheless not intended to be limited to the details shown. Rather, various modifications may be made in details within the scope and range of equivalents of the claims and without departing from the spirit of the invention. For example, while a uni-pole embodiment of the comparator circuit is shown, a bipolar embodiment is also possible.

What is claimed:

1. A power booster and current-measuring circuit, comprising:
    a sense driver comprising a high-impedance operational amplifier with a sense driver feedback loop connected to the inverting input of the high-impedance operational amplifier, the sense driver feedback loop including (a) a high-current operational amplifier with a direct feedback loop connected to its inverting input and connected at its non-inverting input to the output of the high-impedance operational amplifier, and (b) a series of sense resistors having different resistance values;
    a bypass driver comprising a high-current operational amplifier and a feedback loop connected to the inverting input of the high-current operational amplifier;
    means for connecting at least one of the bypass driver and the sense driver to a load;
    means for selecting the appropriate sense resistor for a particular load voltage and load current and connecting it into the sense driver feedback loop to carry the load current while maintaining the output voltage essentially equal to the input voltage; and
    means for measuring the voltage drop across the sense resistor in the sense driver feedback loop thereby determining load current.

2. The power booster and current-measuring circuit of claim 1 wherein the means for measuring the voltage drop across the sense resistor in the sense resistor feedback loop is an instrumentation amplifier having inputs connected across the sense resistor and an output connected through an analog multiplexer to a voltage measurement device.

3. The power booster and current-measuring circuit of claim 1 wherein the means for selecting the appropriate sense resistor comprises a voltage comparator circuit, a microcontroller, and sense resistor relays.

4. The power booster and current-measuring circuit of claim 3 wherein the comparator circuit comprises:
    series of voltage splitter resistors providing up scale and down scale voltage references;
    an UP SCALE comparator amplifier connected at its non-inverting input to the output of the high-current operational amplifier in the sense driver and connected at its inverting input to the up scale voltage reference, whereby when the voltage at the high-current operational amplifier output exceeds the up scale voltage a high-voltage signal is provided to the microcontroller; and
    a DN SCALE comparator amplifier connected at its non-inverting input to the output of the high-current operational amplifier in the sense driver and connected at its inverting input to the down scale voltage reference, whereby when the voltage at the high-current operational amplifier output exceeds the down scale voltage a high-voltage signal is provided to the microcontroller.

5. The power booster and current-measuring circuit of claim 3 wherein the means for connecting at least one of the sense driver and the bypass driver to the load comprises a microcontroller, a sense relay, and a bypass relay.

6. The power booster and current-measuring circuit of claim 3 wherein the sense driver comprises eight sense resistors having resistance values of 1 ohm, 10 ohms, 100 ohms, 1K ohms, 10K ohms, 100K ohms, 1M ohms, and 10M ohms.

7. The power booster and current-measuring circuit of claim 1 wherein the means for connecting at least one of the sense driver and the bypass driver to the load comprises a microcontroller, a sense relay, and a bypass relay.

8. The power booster and current-measuring circuit of claim 1 wherein the sense driver comprises eight sense resistors having resistance values of 1 ohm, 10 ohms, 100 ohms, 1K ohms, 10K ohms, 100K ohms, 1M ohms, and 10M ohms.

9. The power booster and current-measuring circuit of claim 1 further comprising a voltage source connected to the non-inverted inputs of the high-impedance operational amplifier in the sense driver and the high-current operational amplifier in the bypass driver.

10. A power booster and current-measuring circuit comprising:
    a sense driver having a high-input impedance operational amplifier, a high-current operational amplifier connected at its non-inverting input to the output of the high-impedance operational amplifier with a direct feedback loop connected to its inverting input, and a feedback loop including a series of sense resistors with resistance values which are multiples of ten to each other, a series of instrumentation amplifiers including inputs connected across the sense resistors, and a series of relays, whereby when one of the series of relays is closed the feedback loop is closed through the corresponding sense resistor so that the sense resistor carries a current at the high-impedance operational amplifier;

a sense relay connected to the sense driver feedback loop after the sense resistors, which when closed provides a voltage equal to the voltage at the non-inverting input of the high-impedance operational amplifier to a load;

a bypass driver having a high-current operational amplifier and a direct feedback loop;

a bypass relay connected to the bypass driver feedback loop, which when closed provides a voltage equal to the voltage at the non-inverting input of the high-current operational amplifier in the bypass driver;

a comparator circuit having:
  (a) a series of voltage splitter resistors providing reference voltages at an up scale limit, a down scale limit, and an up scale power limit,
  (b) an UP SCALE comparator amplifier having a non-inverting input connected to the output of the high-current operational amplifier in the sense driver and having an inverting input connected to the reference voltage at the up scale limit, whereby when the voltage at the high-current operational amplifier output exceeds the up scale limit a high-voltage signal is generated,
  (c) a DN SCALE comparator amplifier having a non-inverting input connected to the output of the high-current operational amplifier in the sense driver and having an inverting input connected to the reference voltage at the down scale limit, whereby when the voltage at the high-current operational amplifier output exceeds the down scale limit a high-voltage signal is generated, and
  (d) an UP SCALE POWER comparator amplifier having a non-inverting input connected to the reference voltage at the up scale power limit and having an inverting input connected to the positive terminal of a voltage measurement device which is used for measuring the voltage drop across the sense resistor which is in the sense driver feedback loop, whereby when the voltage at the positive terminal of the voltage measurement device is greater than the up scale power limit a low-voltage signal is generated;

an analog multiplexer connected to the outputs of the instrumentation amplifiers, whereby the voltage signal from the instrumentation amplifier corresponding to the sense resistor in the sense driver feedback loop is provided to a voltage measurement device; and a microcontroller which switches one of the sense resistors into the feedback loop for the high-impedance operational amplifier of the sense driver based on the voltage signals generated by the comparator circuit, and switches the sense relay and the bypass relay open or closed based on input from a computer and on internal programming.

11. The power booster and current-measuring circuit of claim 10 wherein the sense driver comprises eight sense resistors having resistance values of 1 ohm, 10 ohms, 100 ohms, 1K ohms, 10K ohms, 100K ohms, 1M ohms, and 10M ohms.

12. The power booster and current-measuring circuit of claim 10 further comprising a voltage source connected to the non-inverted inputs of the high-impedance operational amplifier in the sense driver and the high-current operational amplifier in the bypass driver.

13. The power booster and current-measuring circuit of claim 10 wherein the current supplied to the load is measured to an accuracy of ±0.1% over a current range of 1 ampere to 1 nanoampere.

14. A power booster and current-measuring circuit supplying current to a load, the circuit comprising:

a sense driver consisting of a high-impedance operational amplifier, a high-current operational amplifier connected at its non-inverting input to the output of the high-impedance operational amplifier and at its inverting input to its output through a direct feedback loop, and a feedback loop connecting the output of the high-current operational amplifier to the inverting input of the high-impedance operational amplifier, and comprising eight sense resistors having resistance values of 1 ohm, 10 ohms, 100 ohms, 1K ohms, 10K ohms, 100K ohms, 1M ohms, and 10M ohms, a series of instrumentation amplifiers whose inputs are connected across the sense resistors, and a series of relays, whereby when one of the series of relays is closed the feedback loop is closed through the corresponding sense resistor and the sense resistor carries the load current;

a sense relay connected to the sense driver feedback loop after the sense resistors, which when closed provides a voltage equal to the voltage at the non-inverting input of the high-impedance operational amplifier;

a bypass driver consisting of a high-current operational amplifier and a direct feedback loop;

a bypass relay connected to the bypass driver feedback loop, which when closed provides a voltage equal to the voltage at the non-inverting input of the high-current operational amplifier in the bypass driver;

a voltage source connected to the non-inverting inputs of the high-impedance operational amplifier in the sense driver and the high-current operational amplifier in the bypass driver;

a comparator circuit having:
  (a) a first splitter resistor with a resistance of about 470 ohms, a second splitter resistor with a resistance of about 1.5K ohms, a third splitter resistor with a resistance of about 390 ohms, and a fourth splitter resistor with a resistance of about 27 ohms, the first splitter resistor, the second splitter resistor, the third splitter resistor and the fourth splitter resistor being connected sequentially in series between a +15 volt power source and ground,
  (b) an UP SCALE comparator amplifier having a non-inverting input connected to the output of the high-current operational amplifier in the sense driver and having an inverting input connected to the junction between the first splitter resistor and the second splitter resistor, which has a voltage of about ten volts, whereby when the voltage at the high-current operational amplifier output exceeds ten volts a high-voltage signal is generated,
  (c) a DN SCALE comparator amplifier having a non-inverting input connected to the output of the high-current operational amplifier in the sense driver and having an inverting input connected to the junction between the third splitter resistor and the fourth splitter resistor, which has a voltage of 0.1 volts, whereby when the voltage at the high-current operational amplifier output exceeds 0.1 volts a high-voltage signal is generated, and (d) an UP SCALE POWER comparator amplifier having a non-inverting input connected to the junction between the second splitter resistor and the third splitter resistor, which has a voltage of 2 volts, and having an inverting input connected to the positive terminal of a voltage measurement device which is used for measuring the voltage drop across the sense resistor in the sense driver feedback loop, whereby when the voltage at the positive terminal of the voltage measurement device is greater than 2 volts a low-voltage signal is generated;

an analog multiplexer connected to the outputs of the instrumentation amplifiers, whereby the voltage signal from the instrumentation amplifier corresponding to the sense resistor in the sense driver feedback loop is provided to a voltage measurement device; and a microcontroller which switches one of the sense resistors into the feedback loop for the high-impedance operational amplifier of the sense driver based on the voltage signals generated by the comparator circuit, and switches the sense relay and the bypass relay open or closed based on input from a computer and on internal programming, whereby the current supplied to the load is measured to an accuracy of ±0.1% over a current range of 1 ampere to 1 nanoampere.

15. A method of providing a constant voltage to a load over a range of currents and for accurately measuring the current drawn by the load, the method comprising:

providing a programming voltage to the inputs of a sense driver and a bypass driver, wherein the bypass driver has a high-current op amp acting as a voltage follower and the sense driver has a high-input impedance op amp with a feedback loop which drives its output voltage to its input voltage plus the voltage drop in its feedback loop, the sense driver feedback loop includes a high-current op amp which acts as a voltage follower, providing an output voltage equal to its input voltage at a current required to provide such output voltage to the load, and a sense resistor selected from a series of sense resistors having different resistance values and connected into the sense driver feedback loop to carry the load current;

selecting the appropriate sense resistor such that its voltage drop at the load current can be accurately measured without saturating the sense driver;

connecting at least one of the bypass driver and the sense driver to the load; and measuring the voltage drop across the sense resistor which is in the sense driver feedback loop to determine load current.

16. The method of claim 15 wherein the voltage drop across the sense resistor in the sense resistor feedback loop is measured using an instrumentation amp having inputs connected across the selected sense resistor and an output connected through an analog multiplexer to a voltage measurement device.

17. The method of claim 15 wherein the appropriate sense resistor is selected using a voltage comparator circuit, a microcontroller, and sense resistor relays.

18. The method of claim 17 wherein the comparator circuit comprises:

a 470 ohm first voltage splitter resistor, a 1.5K ohm second voltage splitter resistor, a 390 ohm third voltage splitter resistor, and a 27 ohm fourth voltage splitter resistor connected sequentially in series between a +15 volt power source and ground;

an UP SCALE comparator amplifier having a non-inverting input connected to the output of the high-current op amplifier in the sense driver and having an inverting input connected to the junction between the first voltage splitter resistor and the second voltage splitter resistor, which has a voltage of about 9 volts, whereby when the voltage at the high-current op amplifier output exceeds 9 volts a high-voltage signal is provided to the microcontroller;

a DN SCALE comparator amplifier having a non-inverting input connected to the output of the high-current op amplifier in the sense driver and having an inverting input connected to the junction between the third voltage splitter resistor and the fourth voltage splitter resistor, which has a voltage of about 0.1 volts, whereby when the voltage at the high-current op amp output exceeds 0.1 volts a high-voltage signal is provided to the microcontroller; and an UP SCALE POWER comparator amplifier having a non-inverting input connected to the output of the junction between the second voltage splitter resistor and the third voltage splitter resistor, which has a voltage of about 2 volts, and having an inverting input connected to the positive terminal of a voltage measurement device which is used for measuring the voltage drop across the sense resistor which is in the sense driver feedback loop, whereby when the voltage at the positive terminal of the voltage measurement device is greater than 2 volts a low-voltage signal is provided to the microcontroller.

19. The method of claim 17 wherein at least one of the sense driver and the bypass driver are connected to the load by the sense relay and the bypass relay, which are opened or closed by the microcontroller depending upon voltage signals from the voltage comparator circuit.

20. The method of claim 15 wherein the current supplied to the load is measured to an accuracy of ±0.1% over a current range of 1 ampere to 1 nanoampere.

21. A power booster and current measuring device comprising:

a sense driver including an operational amplifier configured as a voltage follower and a selected one of a series of selectable resistors connected into a feedback loop of the operational amplifier and carrying an output current of the operational amplifier which is essentially equal to an output current of the sense driver; and an element for measuring the voltage drop across the selected resistor to determine the output current.

* * * * *